(12) United States Patent
Igarashi

(10) Patent No.: US 8,508,412 B2
(45) Date of Patent: Aug. 13, 2013

(54) SEMICONDUCTOR PACKAGE AND SEMICONDUCTOR DEVICE

(75) Inventor: Hatsuhide Igarashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 268 days.

(21) Appl. No.: 13/067,138

(22) Filed: May 11, 2011

(65) Prior Publication Data

US 2011/0216455 A1    Sep. 8, 2011

Related U.S. Application Data

(63) Continuation of application No. 12/289,682, filed on Oct. 31, 2008, now Pat. No. 7,973,719.

(30) Foreign Application Priority Data

Nov. 2, 2007   (JP) .................................. 2007-285991

(51) Int. Cl.
*H01Q 1/38*   (2006.01)

(52) U.S. Cl.
USPC .................... 343/700 MS; 343/850; 257/728; 257/701

(58) Field of Classification Search
USPC .................. 343/700 MS, 850; 257/700, 701, 257/690, 693, 723, 728
See application file for complete search history.

(56) References Cited

U.S. PATENT DOCUMENTS

| | | | | |
|---|---|---|---|---|
| 6,046,901 | A * | 4/2000 | Davis et al. ................... | 361/303 |
| 6,972,487 | B2 * | 12/2005 | Kato et al. ..................... | 257/723 |
| 7,095,372 | B2 | 8/2006 | Soler Castany et al. | |
| 7,268,424 | B2 | 9/2007 | Kajimoto et al. | |
| 7,312,528 | B2 | 12/2007 | Watanabe et al. | |
| 2008/0048315 | A1 | 2/2008 | Nagano et al. | |

* cited by examiner

*Primary Examiner* — Hoang V Nguyen
(74) *Attorney, Agent, or Firm* — McGinn IP Law Group, PLLC

(57) ABSTRACT

A semiconductor device, includes a chip, a first external terminal, a second external terminal, and a partial antenna wiring that is coupled to the first external terminal, and that constitutes a matching circuit, wherein the chip includes first and second electrode pads that are coupled to the partial antenna wiring, a third electrode pad that is different from each of the first and second electrode pads, and that is coupled to the second external terminal, and an electrostatic discharge (ESD) protection circuit that is coupled to the third electrode pad.

19 Claims, 9 Drawing Sheets

SEMICONDUCTOR PACKAGE AND SEMICONDUCTOR DEVICE

The present application is a Continuation application of U.S. patent application Ser. No. 12/289,682, filed on Oct. 31, 2008 now U.S. Pat. No. 7,973,719, which is based on Japanese patent application No. 2007-285991, filed on Nov. 2, 2007, the entire contents of which is incorporated herein by reference.

BACKGROUND OF THE INVENTION

1. Field of the Invention

The present invention relates to a semiconductor package and a semiconductor device, in particular, a semiconductor package for manufacturing a semiconductor device connected to an external antenna and a semiconductor device using the semiconductor package.

2. Description of Related Art

A semiconductor chip with radio communication function is used for a mobile communication device and an RFID (Radio Frequency IDentification). The semiconductor chip exchanges data with another mobile communication device or a reader/writer using a radio signal with a frequency in a frequency band of, for example, 2.45 GHz. The semiconductor chip is connected to an antenna suited to a used radio frequency band and performs radio communication with the other mobile communication device via the antenna. The semiconductor chip is typically provided with an RF (Radio Frequency) input/output circuit electrically connected to the antenna and a data processing unit which executes processing a digital signal and the like. The semiconductor chip may also include an input/output circuit for a digital signal or an analog signal. Such semiconductor chip includes a plurality of pad electrodes connected to an output terminal of the RF input/output circuit and an input/output terminal of the input/output circuit.

To protect a circuit mounted on the semiconductor chip against destruction due to ESD (Electrostatic Discharge), an ESD protection circuit is generally formed on the semiconductor chip.

FIGS. 1A and 1B are circuit diagrams showing an ESD protection circuit 3. FIG. 1A is a circuit diagram showing an example of the ESD protection circuit 3. A signal applied to a pad electrode 31 is supplied to an input buffer 34. The ESD protection circuit 3 is formed of a resistor 32, a diode 33 and a diode 35. A surge voltage applied to the pad electrode 31 by ESD is discharged into a power supply wiring 27 and a GND (GRounD) wiring 36 through the resistor 32 by the diode 33 and the diode 35. The surge voltage applied to the pad electrode 31 drops by the resistor 32 and is clamped by the diodes 33 and 35. Thereby, the ESD protection circuit 3 prevents the surge voltage of the pad electrode 31 from being directly applied to an input end of the input buffer 34.

FIG. 1B is an equivalent circuit diagram of the ESD protection circuit 3 in an AC operation in FIG. 1A. PN junctions included in the diode 33 and the diode 35 operate as a capacitor 331 and a capacitor 351, respectively, in the AC operation. As a result, the ESD protection circuit 3 serves as a low-pass filter formed of the resistor 32 and the capacitors 331, 351. Consequently, when the pad electrode 31 is connected to an antenna, characteristics of an AC signal, which is supplied from the antenna and has a frequency in the radio frequency band, are greatly degraded by the ESD protection circuit 3.

However, when the ESD protection circuit 3 is not connected to the pad electrode 31 connected to the antenna, ESD destruction becomes problem in handling of the semiconductor chip and the semiconductor device. This is the case where the RF input/output circuit which is not connected to the ESD protection circuit 3 via the pad electrode is electrically connected to an external terminal of the semiconductor device. In implementing such semiconductor device to the mobile communication device, when the surge voltage due to ESD is applied to the external terminal vulnerable to ESD destruction, the RF input/output circuit is destructed and the mobile communication device becomes a defective product. When the semiconductor device is implemented to the mobile communication device without application of the surge voltage due to ESD, the semiconductor chip is hard to cause ESD destruction in subsequent handling.

U.S. Pat. No. 7,095,372 B discloses an invention related to an integrated circuit package which has an antenna therein.

In this integrated circuit package, a semiconductor chip and a multiply-folded conductive pattern which serves as the antenna are mounted on a substrate. One end of the antenna is connected to the semiconductor chip with a bonding wire and the other end of the antenna terminates within the integrated circuit package without being connected to the external terminal of the integrated circuit package. That is, the conductive pattern which serves as the antenna is not connected to the external terminal, resulting in that the semiconductor chip connected to the conductive pattern with the bonding wire is not connected to the external terminal.

We have now discovered the following facts.

It is necessary to design the semiconductor device to be large in size when the antenna is installed therein. Surely, it is possible to fold the antenna complicatedly by exercise ingenuity based on the technique of loading coils.

However, when the antenna shortening technique is used, characteristics of the antenna are degraded, for example, a frequency band is narrowed and gain is lowered. Generally, an improvement of a distance capable of communication is the most important problem in general performances, and thus, a loss occurrence in the antenna is a grave defect.

SUMMARY

The present invention seeks to solve one or more of the above problems, or to improve upon those problems at least in part.

In one embodiment, a semiconductor package includes: an insulating substrate configured to be provided for mounting a semiconductor chip which processes a signal with a frequency in a radio frequency band, wherein said insulating substrate includes: a first external connecting electrode, a second external connecting electrode, and a partial antenna wiring, wherein said first external connecting electrode and said second external connecting electrode are connected with said partial antenna wiring, wherein each of said first external connecting electrode and said second external connecting electrode is an electrode to be connected with an external antenna pattern.

In another embodiment, a semiconductor device includes: a semiconductor chip configured to process a signal with a frequency in a radio frequency band; and an insulating substrate configured to mount said semiconductor chip, wherein said insulating substrate includes: a first external connecting electrode, a second external connecting electrode, and a partial antenna wiring, wherein said first external connecting electrode and said second external connecting electrode are connected with said partial antenna wiring, wherein said semiconductor chip includes: a transistor configured to output a signal with a frequency in a radio frequency band, wherein an output-side terminal and a ground-side terminal of said transistor are electrically connected to said partial antenna wiring.

In another embodiment, a semiconductor device includes: a semiconductor chip configured to process a signal with a frequency in a radio frequency band; and an insulating substrate configured to mount said semiconductor chip, wherein said insulating substrate includes: an external connecting electrode, a partial antenna wiring configured to be connected to said external connecting electrode, and a wiring configured to be connected to said partial antenna wiring, wherein said semiconductor chip includes: a transistor configured to output a signal with a frequency in a radio frequency band, wherein an output-side terminal and a ground-side terminal of said transistor are electrically connected to said partial antenna wiring, and wherein said ground-side terminal is electrically connected to said wiring.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of a semiconductor package according to the present invention will be described below referring to attached drawings.
(First Embodiment)

Figure 2:
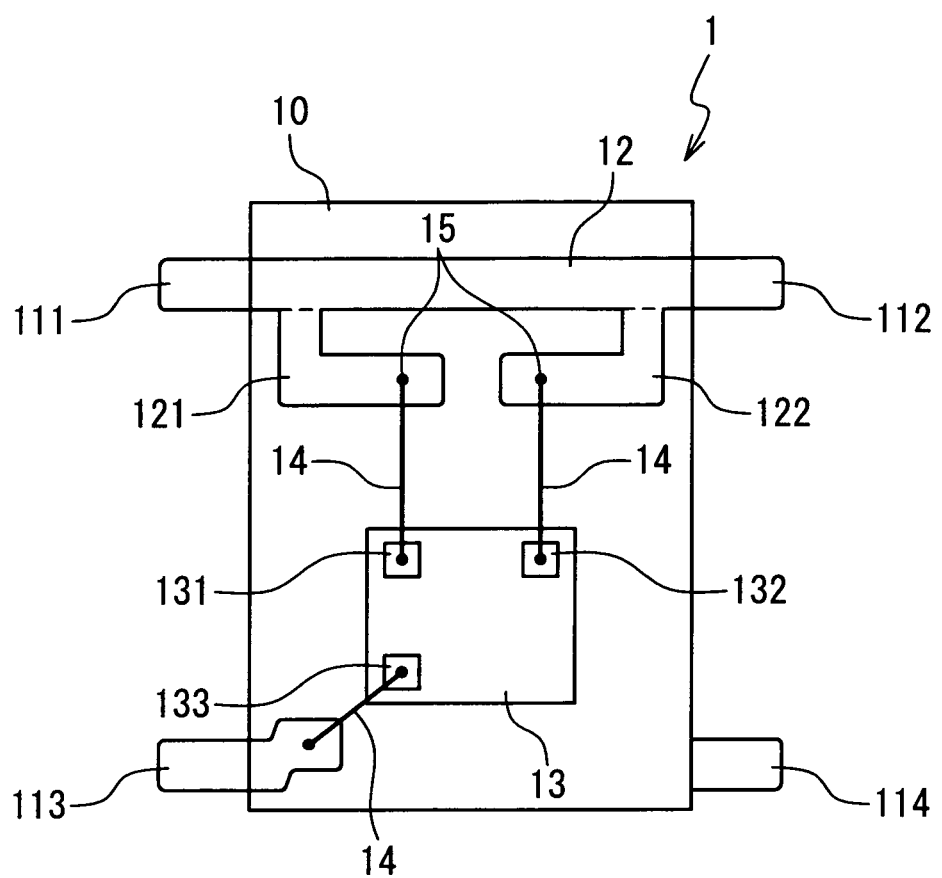
FIG. 2 is a schematic view showing an example of a matching circuit built in a semiconductor package in a first embodiment of the present invention.

FIG. 2 is a schematic view showing an example of a configuration of a semiconductor package 1 in the present embodiment. In the present embodiment, the semiconductor package 1 includes matching circuit wirings 121 and 122 which perform so-called T-matching.

The semiconductor package 1 shown in FIG. 2 includes an insulating substrate 10, a first antenna connecting terminal 111 and a second antenna connecting terminal 112 as external terminals, a partial antenna wiring 12, a first matching circuit wiring 121, a second matching circuit wiring 122, a first general terminal 113 and a second general terminal 114 as external terminals other than the antenna connecting terminals. Here, the partial antenna wiring 12 is linearly formed on the insulating substrate 10 between the first antenna connecting terminal 111 and the second antenna connecting terminal 112. The first matching circuit wiring 121 and the second matching circuit wiring 122 are connected to the antenna partial wiring 12. Although FIG. 2 shows a configuration example having four external terminals 111, 112, 113 and 114, the present invention is not limited to this example. It is needless to say that the number of external terminals is increased or decreased as appropriate depending on the number of pad electrodes 131, 132, 133, and so on of a semiconductor chip 13 mounted on the semiconductor package 1.

The semiconductor chip 13 is mounted on the semiconductor package 1 in FIG. 2. The semiconductor chip 13 includes the first pad electrode 131 and the second pad electrode 132. Each of the first pad electrode 131 and the second pad electrode 132 is connected to an RF input/output circuit 4 mounted on the semiconductor chip 13. The semiconductor chip 13 further includes a third pad electrode 133 connected to a power supply wiring, a GND wiring, an input buffer or the like as necessary. The first pad electrode 131 and the second pad electrode 132 are electrically connected to two bonding wire attaching points 15 of the matching circuit wirings 121 and 122 via the two bonding wires 14, respectively.

In the present embodiment, T-matching is used. Here, the example case will be described where external antenna elements 18 are connected to the partial antenna wiring 12 of the semiconductor package 1 to use a half-wavelength dipole antenna as a whole. Two linear conductors, each of which has a length slightly shorter than a ¼ wavelength, are used as the external antenna elements 18. More specifically, the external antenna element 18 may be a conductive pattern formed on a printed board to which the semiconductor device using the semiconductor package 1 of the present invention. For the T-matching circuit, symmetrical two points are selected which are slightly away from a center of the antenna configured as described above. In this case, for example, the center is a center of the partial antenna wiring 12. The distance between the two points or each position of the two points is appropriately determined by using a simulation, experiment or the like such that the matching circuits work well. At this time, both of the two points must be positioned within the semiconductor package 1 of the present invention. In other words, the minimum size of the semiconductor package 1 of the present invention is determined by the selected positions of the two points. The first matching circuit wiring 121 and the second matching circuit wiring 122 are connected to the antenna at these two points, respectively. Power is supplied to the antenna through the first matching circuit wiring 121 and the second matching circuit wiring 122 in a direction perpendicular to the antenna. That is, a direction of each of the first matching circuit wiring 121 and the second matching circuit wiring 122 and a direction of the partial antenna wiring 12 substantially form a right angle. Here, the "substantially" means that the angle may include a manufacturing error.

Figure 3:
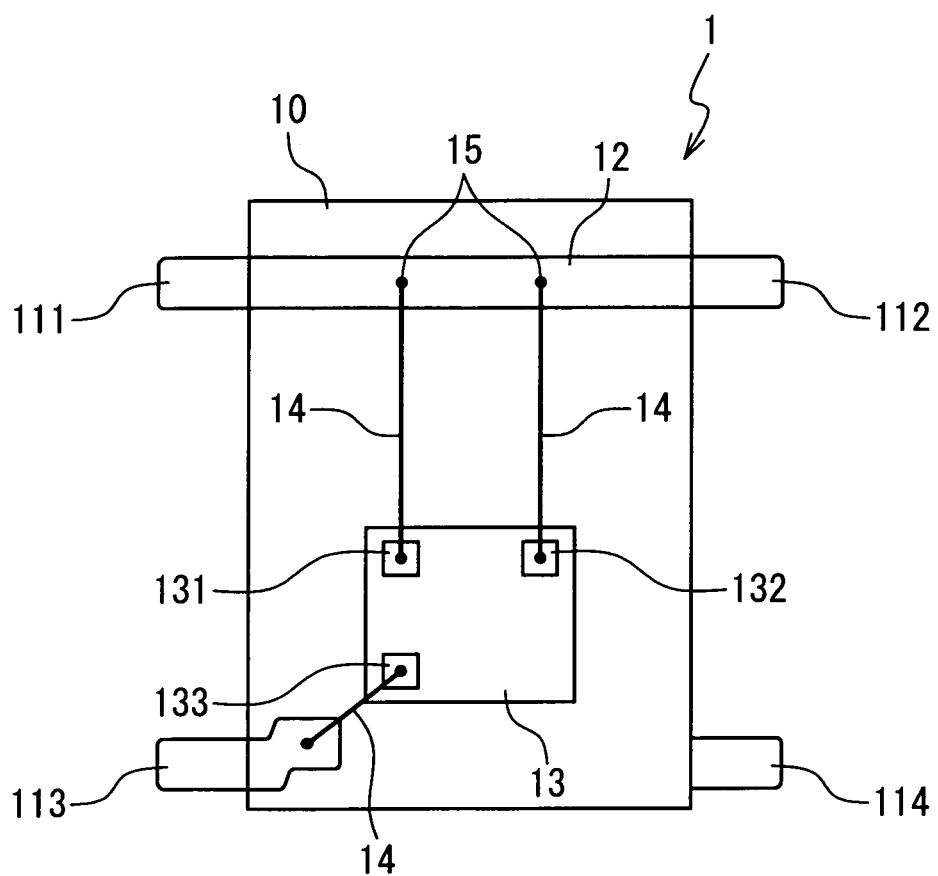
FIG. 3 is a schematic view showing another example of the matching circuit built in the semiconductor package in the first embodiment of the present invention.

FIG. 3 is a schematic view showing another example of the configuration of the semiconductor package 1 in the first embodiment of the present invention. Here, this drawing shows another example of the matching circuit built in the semiconductor package 1. In this example, the semiconductor chip 13 and the partial antenna wiring 12 are directly and electrically connected to each other through the two bonding wires 14. As described above, various matching circuits are possible to apply the semiconductor package 1.

Figure 1A:
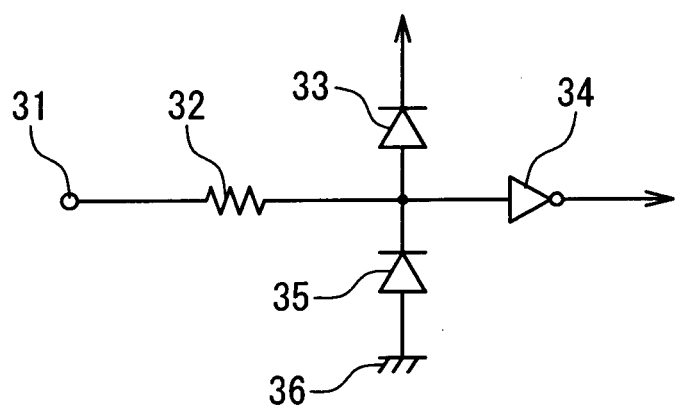
FIG. 1A is a circuit diagram illustrating an example of an ESD protection circuit.
Figure 1B:
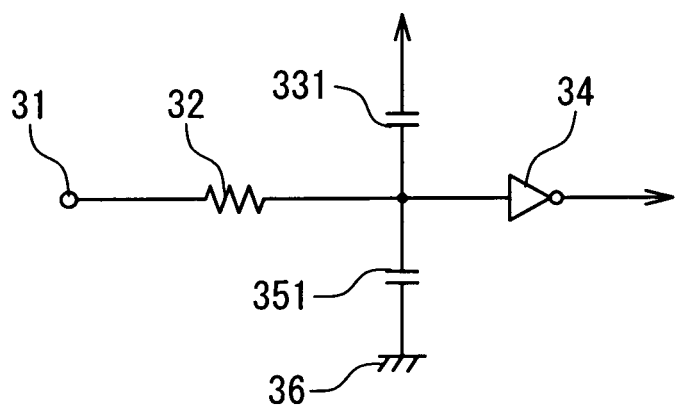
FIG. 1B is a circuit diagram illustrating an equivalent circuit of the ESD protection circuit shown in FIG. 1A.

That is, in the example in FIG. 3, the first matching circuit wiring 121 and the second matching circuit wiring 122 in FIGS. 1A and 1B are omitted. However, if a distance between the two bonding wires 14 is appropriate, this configuration can also constitute the matching circuit.

Figure 4:
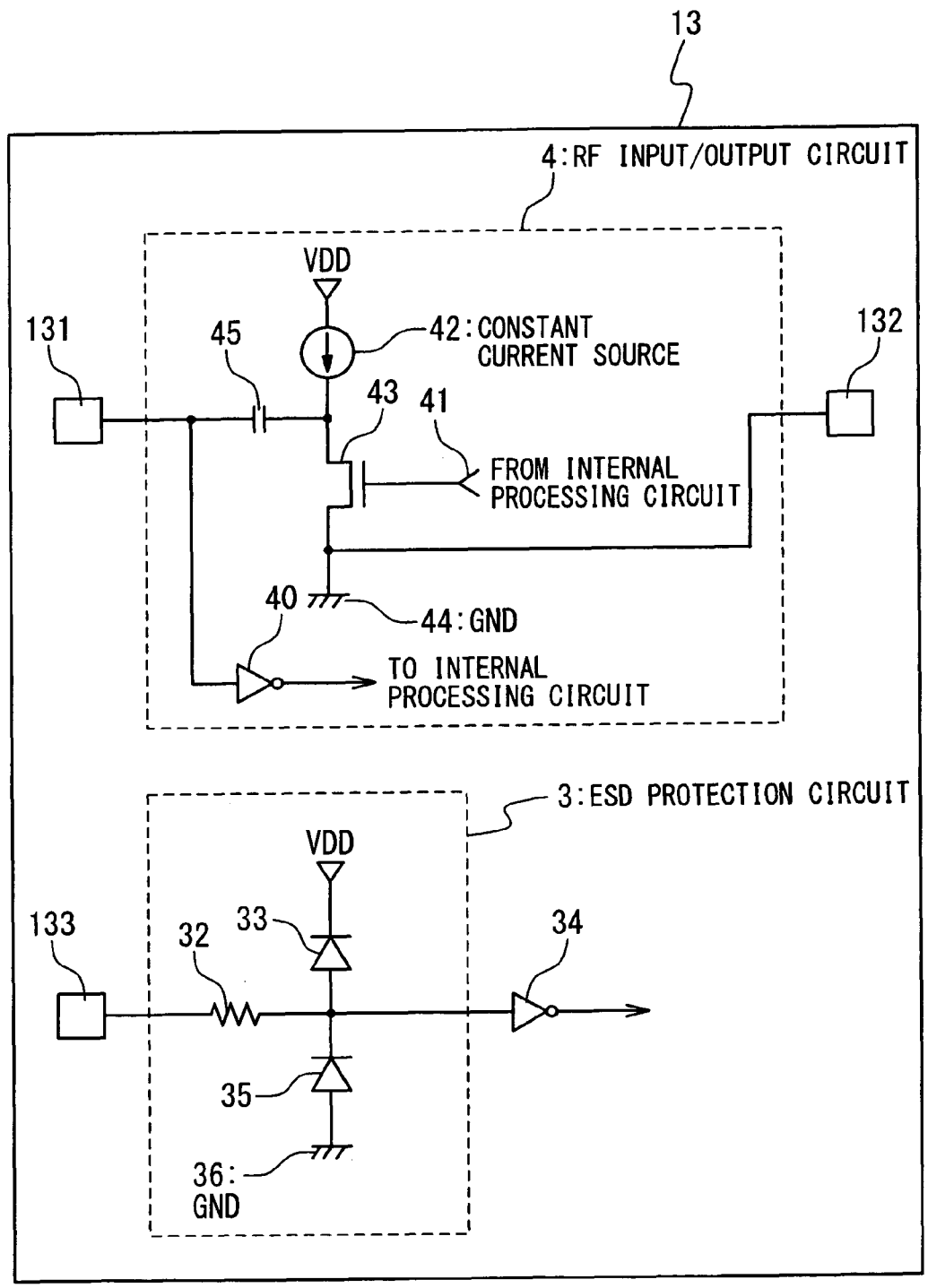
FIG. 4 is an equivalent circuit of a portion connected to a matching circuit, in an internal circuit of a semiconductor chip.

FIG. 4 is an equivalent circuit diagram showing a function of circuits mounted on the semiconductor chip 1 in FIG. 2. In an upper portion in FIG. 4, an RF input/output circuit 4 is disposed which is electrically connected to the antenna and communicates data with external mobile communication device in the radio frequency band. In a lower portion in FIG. 4, an input buffer circuit is disposed which receives an analog or digital signal. The input buffer circuit includes an input buffer 34 and is connected to an ESD protection circuit 3 which is similar to FIG. 1A.

The RF input/output circuit 4 includes an RF output circuit which generates an RF signal to be transmitted and an RF input circuit which receives an RF signal.

The RF output circuit includes a signal input point 41, a constant current source 42, one end of which is connected to a power supply wiring VDD, a MOSFET (Metal-Oxide-Semiconductor Field-Effect Transistor) 43, a GND wiring 44, a capacitor 45, a first matching circuit connecting terminal 131 and a second matching circuit connecting terminal 132.

The MOSFET 43 is connected to the power source 42 at its drain, is connected to the signal input point 41 at its gate and is connected to the GND wiring 44 at its source. The drain of the MOSFET 43 is further connected to the capacitor 45. The capacitor 45 is also connected to the first pad electrode 131 at the other side. That is, the drain of the MOSFET 43 is further connected to the first matching circuit connecting terminal (not shown) through the capacitor 45 and the first pad electrode 131. The source of the MOSFET 43 is further connected to the second matching circuit connecting terminal (not shown) through the second pad electrode 132. Here, the source and the drain may be exchanged with each other depending on a polarity of the MOSFET 43.

The constant current source 42 supplies power to the MOSFET 43. The signal supplied to the signal input point 41 is amplified by the MOSFET 43 and supplied from the drain of the MOSFET 43 to the first pad electrode 131 through the capacitor 45. In the present embodiment, like elements such as the MOSFET 43, the capacitor 45 is formed within the semiconductor chip 13. However, the capacitor 45 may be pulled out the semiconductor chip and connected to the outside of the semiconductor chip as a separate capacitor component. The source of the MOSFET 43 connected to the GND wiring 44 is further connected to the second pad electrode 132.

The RF input circuit includes an input buffer circuit which performs an amplifying operation at an initial stage, and an input end of the input buffer circuit is connected to the first pad electrode 131. The input buffer circuit includes an input buffer 40 whose input end is connected to the first pad electrode 131. In this case, it should be noted that the ESD protection circuit 3 is not connected to the first pad electrode 131. Generally, the ESD protection circuit 3 is connected to the first pad electrode 131 connected to the input/output circuit to protect the capacitor 45 and the input buffer 40 against ESD destruction. However, since the ESD protection circuit 3 serves as a low-pass filter, the ESD protection circuit is not connected to the RF input/output circuit 4 as a circuit connected to the antenna, according to the present invention. Although the second pad electrode 132 is also connected to the RF input/output circuit 4, since the second pad electrode 132 is connected to the source of the MOSFET 43 connected to the GND wiring 44, connection ESD protection circuit 3 is unnecessary.

On the contrary, the ESD protection circuit 3 is connected to the input buffer circuit (a lower portion in FIG. 2) which includes the input buffer 34. Because, in the input buffer circuit, there is no problem regarding an operation of the general digital and analog signals in the radio frequency band.

The reason why the RF input/output circuit 4 which is not connected to the ESD protection circuit 3 is not subjected to ESD destruction is that no voltage is applied to the external terminal 112 connected to the antenna element 18. That is, first, the external terminal 112 is connected to the pad electrode 132 of the semiconductor chip 13 through the partial antenna wiring 12 and the matching circuit wiring 122. Furthermore, in the semiconductor chip 13, the second pad electrode 132 is connected to the GND wiring 44, so that the external terminal 112 is grounded.

Figure 5:
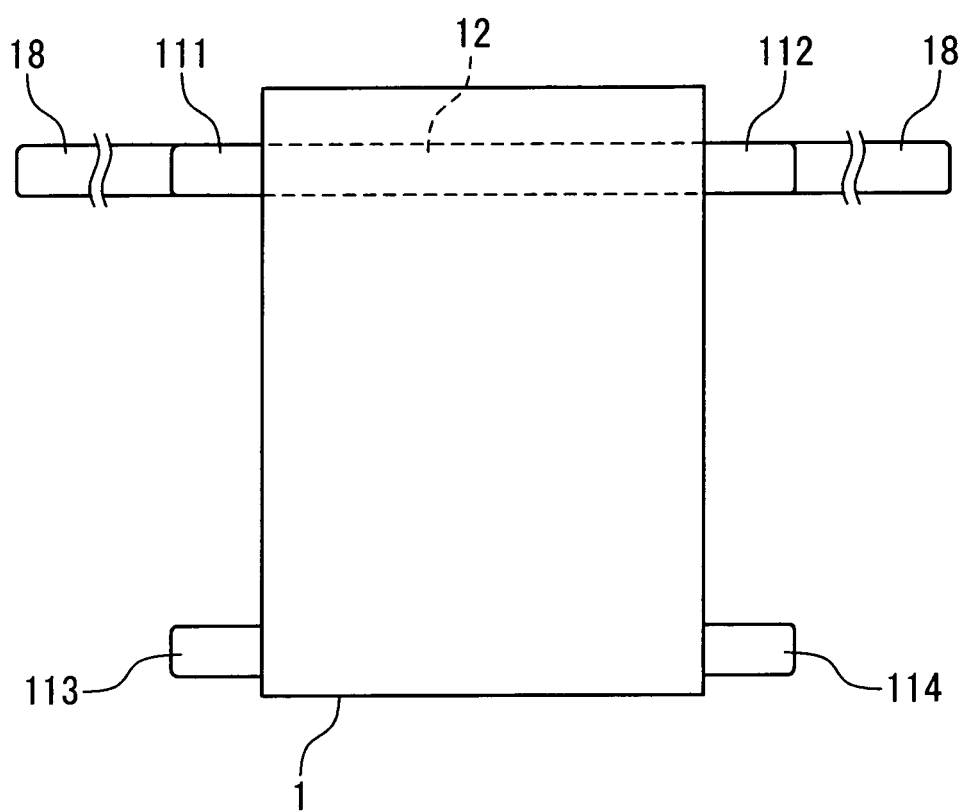
FIG. 5 is a schematic view illustrating a semiconductor device and an external antenna element connected thereto in the first embodiment of the present invention.

FIG. 5 is a schematic view showing a semiconductor device according to the present invention mounted on a mounting board of a mobile communication device. The semiconductor device is obtained by mounting the semiconductor chip 13 on the semiconductor package 1 (insulating substrate 10) and encapsulating it by resin. The semiconductor device includes the first external terminal 111 and the second external terminal 112 which are connected to both ends of the partial antenna wiring 12 formed on the insulating substrate 10, respectively. The first external antenna element 18 and the second external antenna element 18 which serve as the antenna are formed on the mounting board of the mobile communication device. A PCB (Printed Circuit Board) having a plurality of wiring layers is generally employed as the mount board. The first external antenna pattern 18 and the second external antenna element 18 are formed in, for example, wiring layers located on the surface of the mount board. By connecting the first external antenna pattern 18 and the second external antenna pattern 18 to both sides of the partial antenna wiring 12 in the insulating substrate 10, an antenna length necessary for the used radio frequency band can be realized.

An example of more specific shape of the semiconductor package 1 according to the present invention will be described below.

Figure 6:
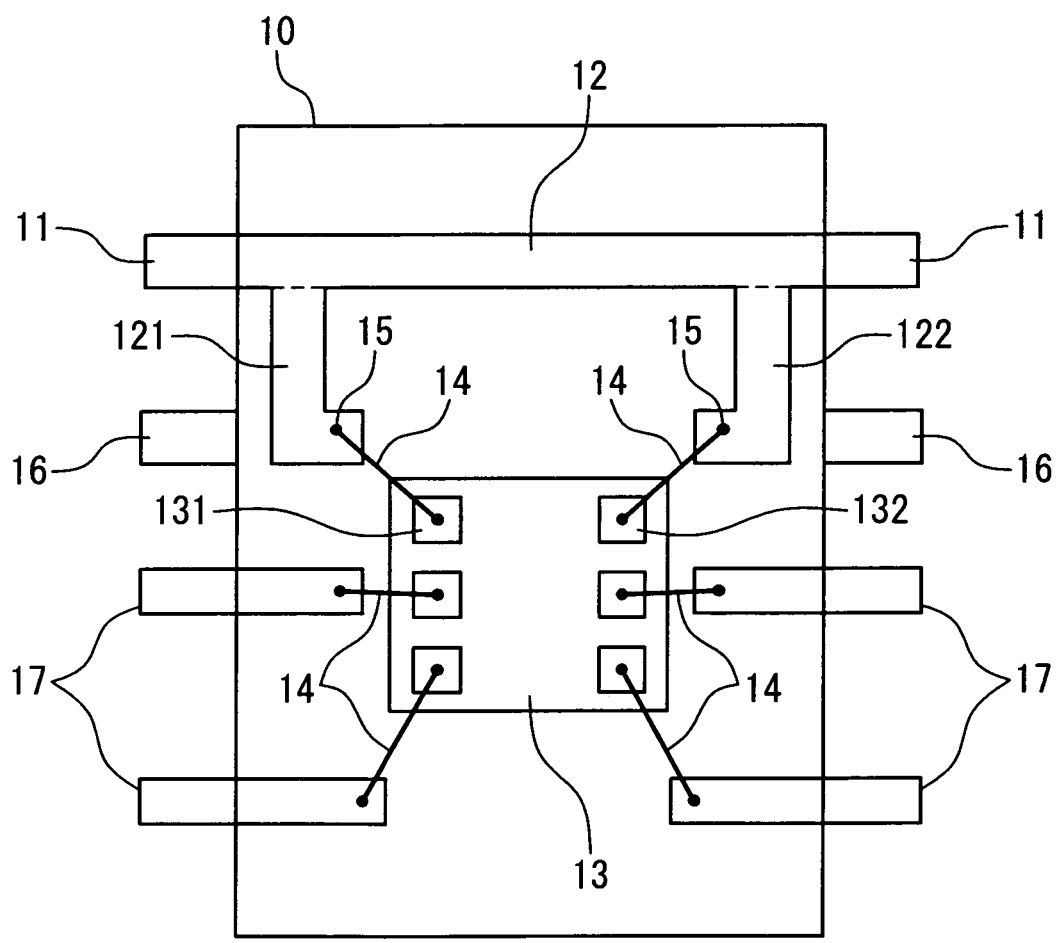
FIG. 6 is a schematic view illustrating application of the present invention to a DIP type integrated circuit.

FIG. 6 is a schematic view showing an application example of the present invention applied to a DIP (Dual In-line Package)-type integrated circuit. In the DIP type integrated circuit, a plurality of external connecting terminals 11, 16, 17 and so on are disposed on each of both long sides of a rectangular integrated circuit body. Here, the partial antenna wiring 12 is provided in the width direction of the integrated circuit and is connected to the two opposed external connecting terminals 11. The partial antenna wiring 12 is connected to the external antenna element 18 through these external connecting terminals 11.

Figure 7:
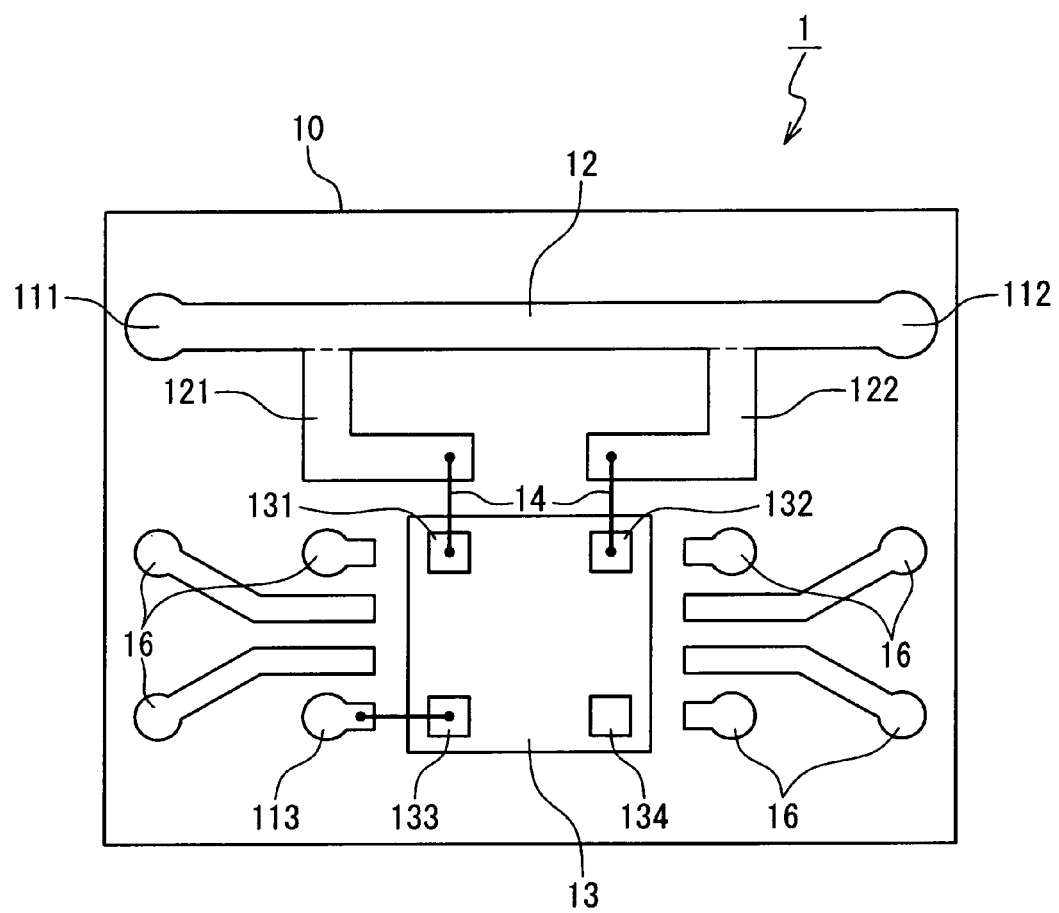
FIG. 7 is a schematic view illustrating application of the present invention to a BGA type integrated circuit.

FIG. 7 is a schematic view showing another application example applied to a BGA (Ball Grid Array)-type semiconductor package of the present invention. In the BGA-type semiconductor package, ball-like small soldered electrodes (not shown) called as "bumps" are used as external terminals 111, 112, 16, 113 and so on. Since the bumps are to be mounted on the insulating substrate 10, the ball electrodes are arranged in an array. Here, the insulating substrate 10 is also called as an "interposer". The semiconductor chip 13, not the ball electrode, is mounted on a center of the insulating substrate 10. A wiring pattern is formed from each ball electrode toward each side of the semiconductor chip 13. The front end of the wiring pattern, that is, the side opposite to the side connected to the ball electrode is connected to the pad electrode on the semiconductor chip 13 with the bonding wire 14. FIG. 7 shows a configuration in which both of the semiconductor chip and the ball electrodes are mounted on one same surface of the insulating substrate 10. However, since those who skilled in the art easily can understand that the semiconductor chip 13 can be formed on the one surface of the insulating substrate 10 while the ball electrodes can be formed on an opposed back surface of the insulating substrate 10. Therefore, a description of this configuration is omitted.

Returning to FIG. 7, the partial antenna wiring 12 as a linear wiring pattern connecting both of the ball electrodes to each other is formed on the insulating substrate 10 between the two ball electrodes. This is a wiring which serves as a part of the antenna. The two matching circuit wirings 121 and 122 are connected to the partial antenna wiring 12. The matching circuit wirings 121 and 122 are connected to the RF input/output circuit 4 formed on the semiconductor chip 13 with the bonding wire 14. FIG. 7 shows the T-matching circuit. However, if the distance between the two matching circuit wirings 121 and 122 is larger than a distance between the bonding wirings of the two bonding pads connected to the RF input/output circuit 4, a delta matching circuit can be realized.

As a matter of course, it is preferable for the semiconductor device according to the present invention to include the ESD protection circuits 3 connected to the external connecting terminals 16, 17, 113 and so on which are irrespective of connection to the antenna.

As describe above, the present invention can be easily applied to semiconductor devices of any shape.

As an example, when electromagnetic wave having a frequency of 2.45 GHz is used, in the case of a half-wavelength dipole antenna, a length of the antenna must be about 6.13 cm. Since the antenna only needs to be formed on the PCB to which the semiconductor device according to the present invention is attached, it does not affect the semiconductor device of the present invention so much. On the other hand, a size of the matching circuit wiring is within the range of 5 to 8 mm. Although this value somewhat depends on an antenna impedance, the value is generally calculated based on the order of 100 ohm. Therefore, even in a small semiconductor package having one side of 1 cm or less, the present invention can be easily achieved.

(Second Embodiment)

Figure 8:
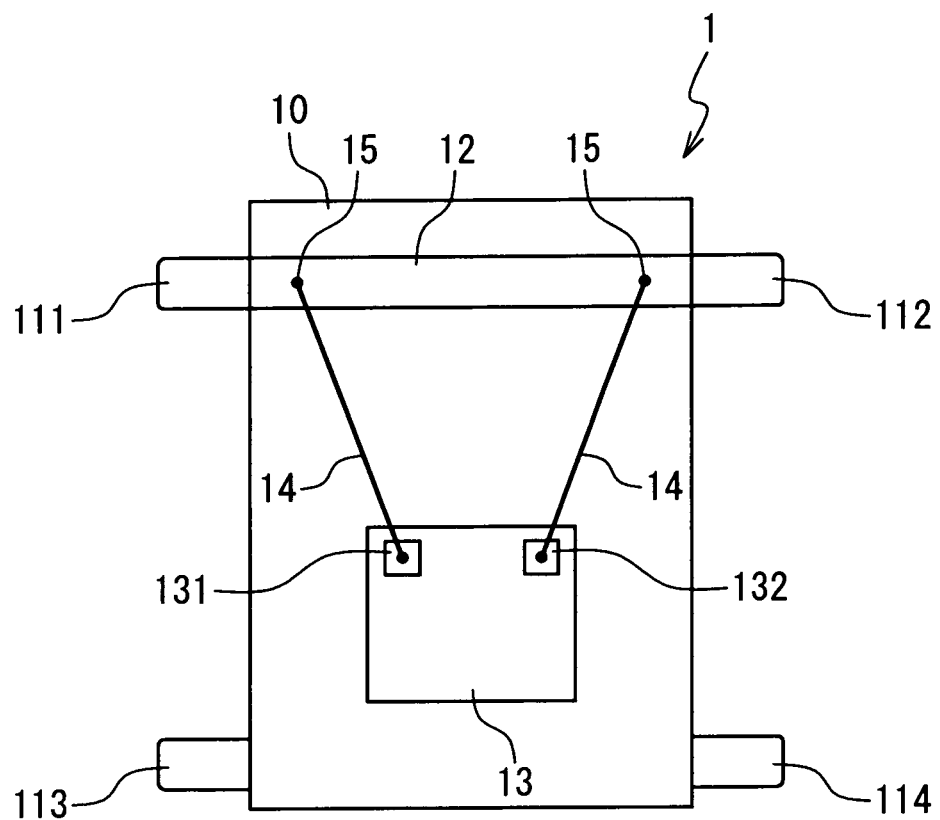
FIG. 8 is a schematic view showing an example of a matching circuit built in a semiconductor package in a second embodiment of the present invention.

FIG. 8 is a schematic view showing an example of a matching circuit built in the semiconductor package 10 in a second embodiment. In the present embodiment, so-called delta-matching is used.

The second embodiment is different from the first embodiment in FIG. 3 in only the shape of two bonding wires 14 electrically connecting the semiconductor chip 13 to the partial antenna wiring 12. That is, in T-matching in the first embodiment, as shown in FIGS. 2 and 3, the two bonding wires 14 are parallel to each other and are perpendicular to the partial antenna wiring 12. On the contrary, in the present embodiment, the two bonding wires 14 and the partial antenna wiring 12 form a triangle. That is, the triangle is framed by a first straight line including the single bonding wire 14, a second straight line including the other single bonding wire 14, and a straight line including the partial antenna wiring 12. The direction of the bonding wire 14 and the direction of the partial antenna wiring 12 forms an acute angle.

The matching with the antenna in such state is generally called as the delta-matching.

For example, in the delta-matching in the half-wavelength dipole antenna, a short linear partial antenna wiring 12 is provided between two external antenna elements, each of which has a length slightly shorter than a ¼ wavelength, and power is supplied to symmetrical two points slightly away from the center of the whole antenna. The matching of antenna can be performed by adjusting each distance or length.

Here, the matching circuit wiring is omitted. However, as in the first embodiment shown in FIGS. 1A and 1B, the matching circuit wirings may be connected to the partial antenna wiring 12 such that the two matching circuit wirings 121 and 122 and the partial antenna wiring 12 form a triangle. In this case, the triangle is framed by a first straight line including the matching circuit wiring 121, a second straight line including the matching circuit wiring 122, and a straight line including the partial antenna wiring 12.

The direction of each of the matching circuit wirings 121 and 122 and the direction of the partial antenna wiring 12 form an acute angle. Since other descriptions in the present embodiment are the same as those in the first embodiment, they are omitted.

(Third Embodiment)

Figure 9:
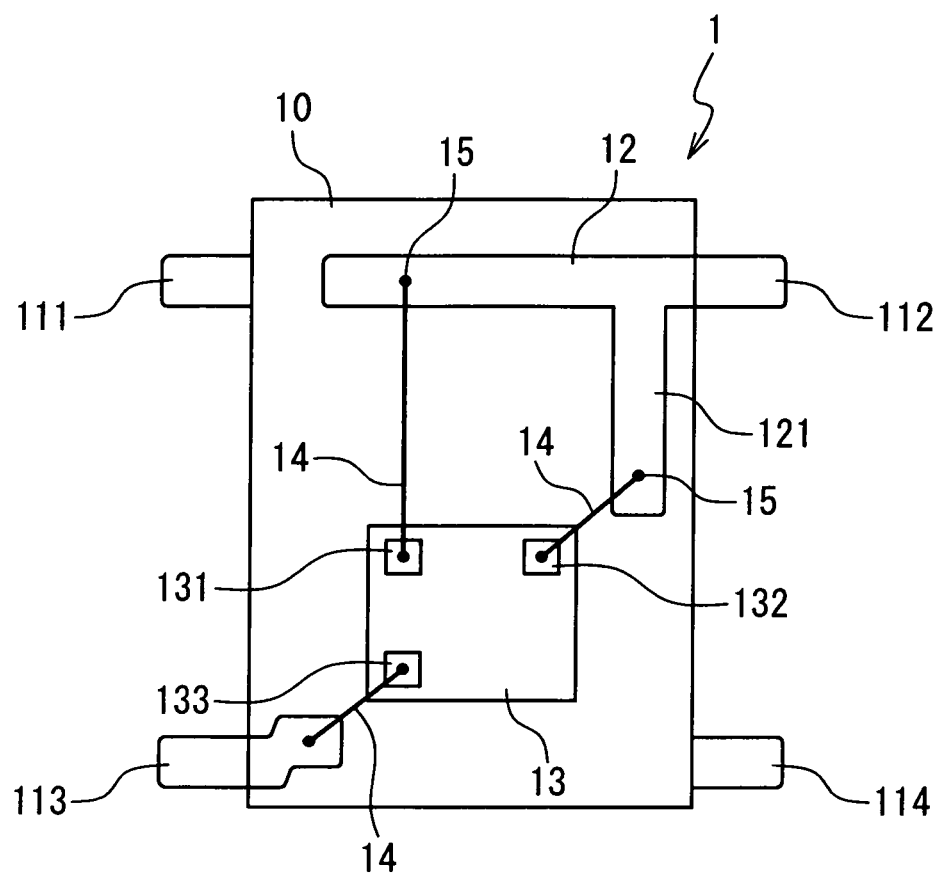
FIG. 9 is a schematic view showing an example of a matching circuit built in a semiconductor package in a third embodiment of the present invention.

FIG. 9 is a schematic view showing an example of a matching circuit built in a semiconductor package in a third embodiment. In the present embodiment, so-called gamma-matching is used.

A main difference between the present embodiment and the first and second embodiments is that the external antenna element 18 is connected to only one end of the partial antenna wiring 12. That is, for example, a ¼-wavelength whip antenna or a ¼-wavelength monopole antenna is connected to the partial antenna wiring 12.

The gamma-matching is equivalent to directly connecting one of the power supply points of the T-matching to the center of the antenna, that is, the center of the partial antenna wiring, in the first embodiment. Accordingly, in the present embodiment, the number of the matching circuits connected to the partial antenna wiring is one (1).

The gamma matching circuit shown in FIG. 9 can be realized in the BGA-type semiconductor package according to the present invention by appropriately changing the shape of the matching circuit wiring to gamma shape. In this case, the two antenna connecting terminals 111 and 112 are bumps, and the antenna element 18 is connected to the matching circuit 121 through the bumps. A terminal 16 which does not contribute to an electrical connection between the semiconductor chip 13 and the outside of the semiconductor device may be provided.

The gamma-matching itself can be achieved by a dipole. In this case, one side of the power supply line is located at the center of the antenna.

Since other descriptions in the present embodiment are the same as those in the first embodiment, they are omitted.

The semiconductor package 1 which includes the matching circuit therein according to the present invention has been described. In the examples for explanation, the antenna portion may not be precisely separated from the matching circuit portion. That is, there may be some opinions that the antenna may be included in the so-called matching circuit. However, the difference between them will be obvious for those who skilled in the radio communication field. In other words, according to the present invention, a portion which is built in the semiconductor package 1 and called as the matching circuit and a portion which is provided outside of the semiconductor package and called as the antenna or the external antenna element 18 perform different roles and thus, these portions can be readily distinguished from each other.

Furthermore, in this specification, only the half-wavelength dipole antenna is described. However, as a matter of course, the present invention can be employed to the dipole antenna with integral multiple of the half-wavelength. The present invention can be also applied to a whip-type specific length such as ⅝-wavelength.

A semiconductor package according to the present invention includes an antenna matching circuit and an antenna, partial wiring related to matching therein. Since the antenna body is provided outside of the semiconductor device, the antenna can be freely designed without being affected by size of the semiconductor device. Therefore, performance of the antenna is not sacrificed.

In the semiconductor package according to the present invention, the matching circuit as a conductor is connected to the semiconductor chip at two points. Since this condition corresponds to the short-circuit state in terms of a direct current mode, the ESD protection circuit is not required. Consequently, it does not cause lowering of impedance.

Furthermore, the semiconductor package according to the present invention fits inside the general semiconductor device. For example, in the case of frequently-used frequency band of 2.45 GHz, when a T-type matching circuit is provided, a length of a side of the semiconductor package is 1 cm or less.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A semiconductor device, comprising:
    a chip;
    a first external terminal;
    a second external terminal; and
    a partial antenna wiring that is coupled to the first external terminal, and that constitutes a matching circuit,
    wherein the chip comprises:
        first and second electrode pads that are coupled to the partial antenna wiring;
        a third electrode pad that is different from each of the first and second electrode pads, and that is coupled to the second external terminal; and
        an electrostatic discharge (ESD) protection circuit that is coupled to the third electrode pad.

2. The semiconductor device according to claim 1,
wherein the ESD protection circuit comprises:
    a first diode that is coupled between a first reference potential and the third electrode pad; and
    a second diode that is coupled between a second reference potential and the third electrode pad.

3. The semiconductor device according to claim 1,
wherein the chip further comprises:
    an input buffer that is coupled to the third electrode pad, and
wherein the ESD protection circuit is arranged between the third electrode pad and the input buffer.

4. The semiconductor device according to claim 1,
wherein the chip is free from an ESD protection circuit that is coupled to each of the first and second electrode pads.

5. The semiconductor device according to claim 1,
wherein the chip further comprises:
    a radio frequency (RF) input/output circuit that is coupled to the first and second electrode pads, and
wherein the RF input/output circuit comprises:
    an input buffer that is coupled to the first electrode pad; and
    a transistor that is coupled between the first and second electrode pads.

6. The semiconductor device according to claim 5,
wherein a first node between the first electrode pad and the transistor is coupled to a first reference potential, and
wherein a second node between the second electrode pad and the transistor is coupled to a second reference potential.

7. The semiconductor device according to claim 6,
wherein the RF input/output circuit further comprises:
    a capacitor that is coupled between the first electrode pad and the first node; and
    a current source that is coupled between the transistor and the first node.

8. The semiconductor device according to claim 1,
wherein the first external terminal is connectable with an external antenna.

9. The semiconductor device according to claim 1, further comprising:
    a matching circuit wiring that is coupled between the partial antenna wiring and one of the first and second electrode pads, and that constitutes the matching circuit,
    wherein a direction of the matching circuit wiring is substantially perpendicular to a direction of the partial antenna wiring.

10. The semiconductor device according to claim 1, further comprising:
    a third external terminal that is coupled to the partial antenna wiring,
    wherein the partial antenna wiring is arranged between the first and third external terminals.

11. The semiconductor device according to claim 10,
wherein each of the first and third external terminals is connectable with an external antenna.

12. The semiconductor device according to claim 10, further comprising:
    a first matching circuit wiring that is coupled between the partial antenna wiring and the first electrode pad, and that constitutes the matching circuit; and
    a second matching circuit wiring that is coupled between the partial antenna wiring and the second electrode pad, and that constitutes the matching circuit.

13. The semiconductor device according to claim 12,
wherein a first matching circuit wiring includes a first portion that is substantially placed perpendicular to a direction of the partial antenna wiring and a second portion that is substantially placed parallel to the direction of the partial antenna wiring, and
wherein a second matching circuit wiring includes a third portion that is substantially placed perpendicular to the direction of the partial antenna wiring and a fourth portion that is substantially placed parallel to the direction of the partial antenna wiring.

14. The semiconductor device according to claim 13,
wherein the first electrode pad is coupled to the second portion by a first bonding wire, and
wherein the second electrode pad is coupled to the fourth portion by a second bonding wire.

15. The semiconductor device according to claim 14,
wherein a direction of the first bonding wire is substantially parallel to a direction of the second bonding wire.

16. The semiconductor device according to claim 14,
wherein the second portion and a direction of the first bonding wire form an acute angle, and
wherein the fourth portion and a direction of the second bonding wire form an acute angle.

17. The semiconductor device according to claim 1,
wherein the first electrode pad is coupled to the partial antenna wiring by a first bonding wire, and
wherein the second electrode pad is coupled to the partial antenna wiring by a second bonding wire.

18. The semiconductor device according to claim 17,
wherein a direction of the first bonding wire is substantially parallel to a direction of the second bonding wire.

19. The semiconductor device according to claim 17,
wherein a direction of the partial antenna wiring and each of a direction of the first bonding wire and a direction of the second bonding wire form an acute angle.

* * * * *